United States Patent [19]

Delfino et al.

[11] 4,431,900
[45] Feb. 14, 1984

[54] LASER INDUCED FLOW GE-O BASED MATERIALS

[75] Inventors: Michelangelo Delfino; William I. Lehrer, both of Los Altos, Calif.

[73] Assignee: Fairchild Camera & Instrument Corporation, Mountain View, Calif.

[21] Appl. No.: 339,601

[22] Filed: Jan. 15, 1982

[51] Int. Cl.³ .............................................. B23K 27/00
[52] U.S. Cl. ........................ 219/121 LM; 219/121 L; 219/121 LF
[58] Field of Search ..... 219/121 L, 121 LM, 121 LE, 219/121 LF; 427/53, 1

[56] References Cited
U.S. PATENT DOCUMENTS 3,542,572  11/1970  Dalton et al. ........................ 106/52
4,284,659  8/1981   Vaccodine et al. ...... 219/121 LE X

OTHER PUBLICATIONS

Hitachi Seisakusho et al., Abstract of S.N. 114355, Pub. 10/78, Japan.

*Primary Examiner*—C. L. Albritton
*Attorney, Agent, or Firm*—Kenneth Olsen; Carl Silverman; Alan H. MacPherson

[57] ABSTRACT

In a semiconductor device, laser energy is used to selectively heat various $SiO_2$ and/or $GeO_2$ based materials to elevated temperatures while maintaining the active device region and electrical interconnects at relatively low temperatures, to for example, induce densification and/or flow of the $SiO_2$ and/or $GeO_2$ based material to round off sharp edges and stops, without damaging or affecting the active region and electrical interconnects.

15 Claims, 10 Drawing Figures

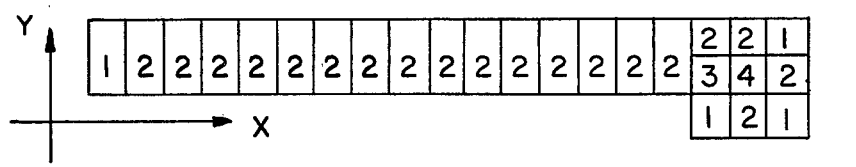
FIG. 7a
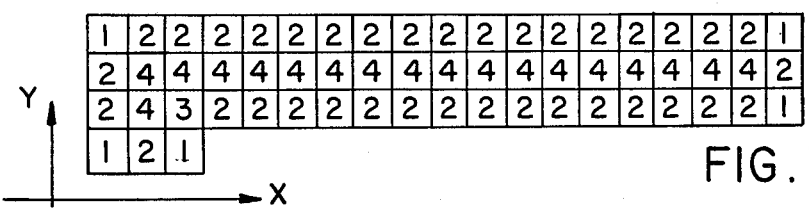
FIG. 7b
FIG. 7c
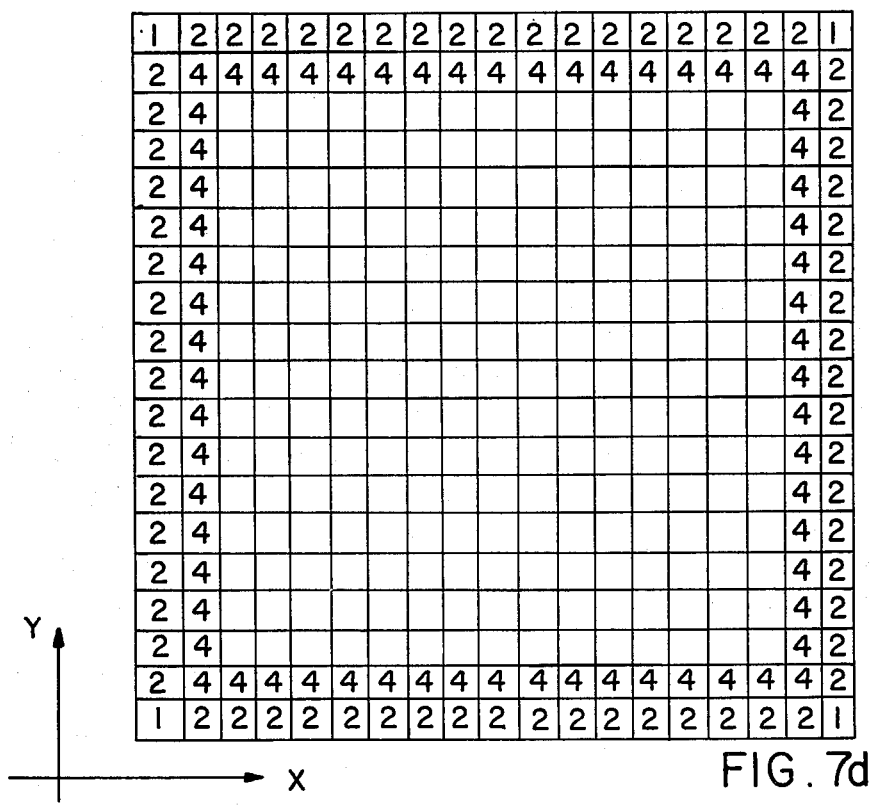
FIG. 7d

LASER INDUCED FLOW GE-O BASED MATERIALS

RELATED APPLICATION

This Application is related to application Ser. No. 300,706, which is a continuation of Ser. No. 143,983 filed Apr. 28, 1980, both of which are hereby incorporated by reference.

BACKGROUND

1. Field of the Invention

This invention relates to the heating of materials based on oxides of silicon and/or germanium such as $SiO_2$ and $GeO_2$ and is particularly useful in the manufacture of semiconductor devices.

2. Description of the Prior Art

In the manufacture of semiconductor devices, phosphosilicate glass is often used to form a protective coating on partially completed devices. To prevent cracks from forming in conductive leads or contacts to be formed on the surface of this coating, abrupt changes in the height of this coating must be eliminated. This is usually done by reheating the glass coating to "flow" the glass so as to smooth out surface discontinuities.

The phosphosilicate glass "flow" or "reflow" process both rounds off sharp edges of etched cuts on phosphosilicate glass to help prevent cracking at these edges of subsequently deposited metal or polycrystalline silicon and smooths the overall surface of a layer of phosphosilicate glass to enhance the subsequent controlled etching thereof. The flow is normally induced by a high temperature (approximately 950° C. or above) furnace anneal, for approximately 30 to 60 minutes.

In general, the phosphosilicate glass layer is part of a structure initially formed by providing a silicon substrate with a thermally deposited silicon dioxide ($SiO_2$) layer thereon. A layer of $P_2O_5$-$SiO_2$ is then deposited on the layer of thermally deposited $SiO_2$ by, for example, chemical vapor deposition (CVD) involving the reaction of a phosphorus-silane mixture and oxygen at low temperature (i.e. about 400° C.), so that a top layer of phosphosilicate glass is provided. Such a CVD process is described, for example, in an article by Kern, et al. entitled "CVD Glass Films for Passivation of Silicon Devices: Preparation, Composition and Stress Properties", appearing in RCA Review, Vol. 37, March 1976, pages 3-54, which is hereby incorporated by reference.

A major problem with the prior art approach of inducing flow by high temperature anneal is that when semiconductor device structures are heated to a relatively high temperature in the furnace, the properties of these structures often undesirably change due to dopant diffusion, alloying and contamination. For example, aluminum alloys with silicon at 577° C. and melts at 660° C.. Thus, any reflow performed at temperatures in excess of these temperatures will destroy or alter any aluminum present in the device. The diffusion of dopants at high temperatures (e.g. temperatures above 900° C.) is well known. Another problem is that dopants, such as $P_2O_5$ typically in the concentration of 7-9 mole percent, must be added to the $SiO_2$ base composition to lower the flow temperature. The presence of phosphorus in the glass subsequently enhances corrosion of commonly-used aluminum interconnections.

The use in semiconductor devices of glass layers comprising germanium oxide ($GeO_2$) has been disclosed in U.S patent applications Ser. No. 243,987 filed Mar. 16, 1981, Ser. No. 243,988 filed Mar. 16, 1981, and Ser. No. 243,989 filed Mar. 16, 1981, which are assigned to Fairchild Camera & Instrument Corporation, the assignee of this application. These three copending applications are hereby incorporated by reference. The use in semiconductor devices of glasses including an oxide of germanium such as $GeO_2$ is advantageous due to the fact that such glasses flow at lower temperatures than do glasses comprised solely of $SiO_2$.

SUMMARY

In accordance with this invention, a highly efficient method is provided for inducing densification and/or flow of glasses comprising $SiO_2$, $GeO_2$ or the like so as to substantially overcome the problems set forth above.

Broadly stated, one embodiment of the invention comprises a method of inducing flow or densification of a first portion of a structure in close proximity to a second portion of the structure, the first portion being of the type wherein flow or densification is induced therein upon application of heat thereto, comprising heating the first portion to an extent substantially greater than the second portion. The first portion of the structure comprises either oxide of silicon (such as $SiO_2$) based materials or oxide of germanium (such as $GeO_2$) based materials. Oxide of silicon is often referred to as silicon-oxygen bonded material and oxide of germanium is often referred to as germanium-oxygen bonded material. In accordance with this invention, the application of heat to said first layer is provided by directing a laser beam upon the first portion thereby heating the first portion.

In another embodiment of this invention, the first portion of the structure comprises a mixture of oxides of silicon and germanium, such as a mixture of $SiO_2$ and $GeO_2$.

The invention will be more fully understood in accordance with the following detailed description taken together with the drawings.

BRIEF DESCRIPTION OF THE DRAWINGS

FIGS. 7a, 7b, 7c and 7d illustrate the laser beam scanning pattern utilized in one embodiment of this invention to scan the laser beam across a semiconductor wafer in accordance with this invention.

DETAILED DESCRIPTION

Figure 1:
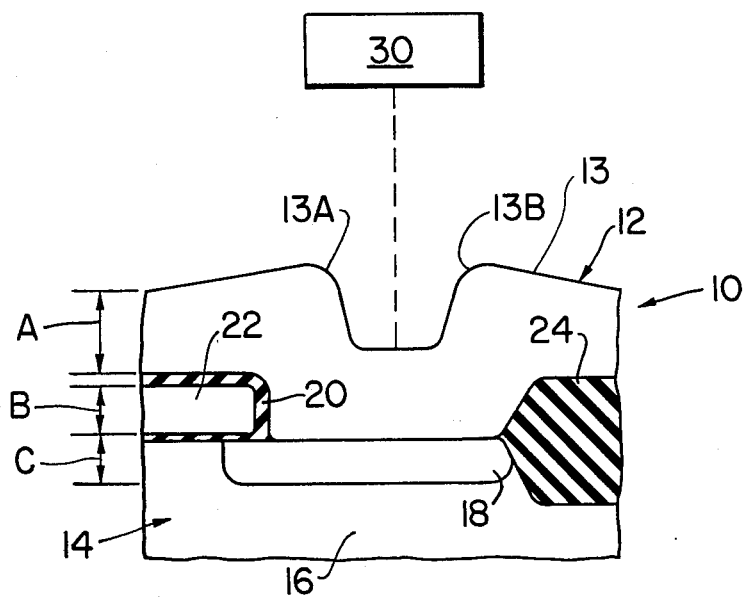
FIG. 1 is a schematic cross section of a semiconductor structure being scanned with a laser beam in accordance with this invention.

As explained above, FIGS. 1-5 illustrate process steps of the present invention. As shown in FIG. 1, a semiconductor structure 10 typified by a metal oxide silicon (MOS) device includes a first portion 12 which is in the form of silicon dioxide (sometimes phosphorus doped) or germanium dioxide based glass or a mixture thereof. Glass 12 is in close proximity to a second structure portion 14. The second portion 14 includes a silicon substrate 16 having a source or drain portion 18 formed therein, an oxide region 20, an interconnect 22 (typically comprising polycrystalline silicon, metal silicides, or metallization, such as aluminum or doped aluminum) and isolation oxide 24. Typically, the thickness of glass 12 (dimension "A") is on the order of 1.0–1.5 microns, the thickness of polycrystalline silicon interconnect 22 (dimension "B") is of the order of 0.4 micron–0.6 micron, and the thickness of source/drain region 18 (dimension "C") is of the order of 0.4 micron–0.6 micron. The structure shown in cross-section in FIGS. 1 through 5 is a portion of a larger structure, such as an integrated circuit. Techniques for the formation of integrated circuits and semiconductor devices of the type shown in FIGS. 1 to 5 are well-known and thus will not be described in detail.

As described above, and as will be further described, it is desirable to heat glass 12 to induce densification and/or flow thereof. As also discussed above, it is desirable to maintain the portion 14 at a relatively low temperature so as to avoid undesired dopant diffusion, alloying, destruction of interconnect 22 and/or contamination. In accordance with our invention, this is done by using a laser beam having a frequency carefully selected to maximize the absorption of energy by the glass to be heated and, correspondingly, to minimize the absorption of energy by the adjacent materials in the structure such as conductive material (such as metal) and/or semiconductor material.

This invention makes use of the fact that the absorption maxima of silicon-oxide molecules (including but not limited to $SiO_2$) for incident radiation is centered at about 9.261 microns (1,080 $cm^{-1}$ or approximately 240 $cm^{-1}$ bandwidth FWHM) and the absorption maxima of germanium-oxide molecules (including but not limited to $GeO_2$) for incident radiation is centered at about 10.87 microns (920 $cm^{-1}$ or approximately 240 $cm^{-1}$ bandwidth FWHM) with an absorption coefficient of about $3 \times 10^4$ $cm^{-1}$. For either $SiO_2$ or $GeO_2$, by increasing the dopant concentration of phosphorus pentoxide ($P_2O_5$) in the glass up to 20 mole percent $P_2O_5$, the 1,080 $cm^{-1}$ absorption band decreases monotonically with an increase in mole percent of $P_2O_5$. Comparable concentrations of oxides of boron, arsenic or antimony (such as $B_2O_3$, $As_2O_5$ or $Sb_2O_5$) in $SiO_2$ and $GeO_2$ will exhibit similar absorption characteristics. The addition of $Si_3N_4$ to $SiO_2$ and $GeO_2$ yields glasses which also behave similarly. Thus, any $SiO_2$ or $GeO_2$ based material with greater than approximately 80 mole percent of base material (by "base material" is meant $SiO_2$ and/or $GeO_2$), whether it be crystalline or amorphous, can be effectively flowed utilizing the output of a laser, and preferably a laser which is tunable, in accordance with the teachings of this invention. However, as the concentration of $SiO_2$ and/or $GeO_2$ base material decreases below about 80 mole percent, the coupling of the laser energy to the glass to be flowed is sufficiently decreased so as to prevent glass flow. With higher 9–11 micron laser power applied to a structure comprising base material of less than about 80 mole percent Si-O/Ge-O material, coupling to the base material is rather low, thus causing the entire structure to be heated, rather than the desired preferential heating of the to-be-flowed base material. Of course, in accordance with the teachings of this invention, laser energy of wavelengths which are approximately equal to the absorption maxima of any base material (including base material of less than about 80 mole percent Si-O/Ge-O) can be utilized to preferentially heat (and thus flow) the base material. It has been determined that the use of laser energy of wavelengths other than 9.261 microns (preferably within the range of approximately nine to eleven microns) may be utilized to flow $SiO_2$ or $GeO_2$ based glasses or combinations thereof in accordance with this invention. Such wavelengths provide sufficient coupling of the laser energy to the Si-O and/or Ge-O based glasses to cause glass flow in accordance with this invention.

One laser which may be utilized in accordance with this invention comprises a Model 560 gas laser as manufactured by Apollo Lasers, Inc., 6357 Arizona Circle, Los Angeles, California 90045. This is a "flowing" $CO_2$ gas laser comprising 6% $CO_2$, 18% $N_2$ and 76% He, with emissions at either 9.553, 10.247 or 10.591 microns. The term "flowing" when utilized in conjunction with a laser, refers to the characteristic of the gases within the laser, and not that the laser may be utilized in conjunction with this invention to flow $SiO_2$ and $GeO_2$ based material. Alternatively, glasses may be flowed utilizing the Apollo Model 560 flowing $N_2O$ gas laser comprising 12% $N_2O$, 9% C0, 16% $N_2$ and 63% He with emissions at either 10.474 or 10.842 microns, operated in the pulsed mode with a pulse width of 110 microseconds (FWHM-Full width at half maximum) and a pulse repetition frequency of 106 Hz. Yet another laser which may be utilized in accordance with this invention is a TEA-$CO_2$ gas laser, such as the Model 820 manufactured by Lumonics of Kanata, Canada, comprising 1% $CO_2$, 14% $N_2$, and 85% He with an emission at 10.6 microns, operated in the pulsed mode with a pulse width of 6 microsecond (FWHM) and a pulse repetition rate of 1 Hz. The energy pulse as supplied to the lasers to provide laser radiation for use in the flow or densification of $SiO_2$ and/or $GeO_2$ based materials in accordance with this invention comprises an additional spike of high peak power followed by a power tail accounting for the bulk of the energy radiated by the laser. The flowing $CO_2$ gas laser and flowing $N_2O$ gas laser are powered by a waveform comprising a very narrow high powered spike of around 0.1 to 0.2 microseconds duration, followed by a power tail of approximately 110 microseconds from full width half maximum (FWHM) points. The TEA-$CO_2$ laser was powered by a waveform comprising a spike of 10 to 100 nanoseconds width, followed by a power tail of approximately 100 to 200 microseconds in width. The operating characteristics, including the techniques for measuring power and the explanation of the full width half maximum (FWHM) standards, are well known in the laser art and thus will not be described here.

A preferred laser energy source for use in conjunction with this invention comprises a $CO_2$ gas laser comprising 6% $CO_2$, 18% $N_2$, and 76% He, utilizing a 32 KV discharge voltage, and 3.4 joules discharge energy emitted from the laser. The laser is operated in multimode, thereby providing a laser beam of square cross section approximately 1 cm square. The laser is powered at a repetition rate of approximately 5 Hz, and the laser beam scans the wafer at approximately 2 cm per second, with an overlap between adjacent scans of approximately 0.5 cm. In this manner, each point on the wafer (except possibly small areas around the edge of the wafer) receive four applications of laser energy, each application lasting approximately 0.5 seconds. This scanning procedure will be explained later in conjunction with the description of FIGS. 7a, 7b, 7c and 7d. The energy from the laser is focused by a germanium meniscus lens of two inches diameter and 15 inches focal length.

At these wavelengths (nine to eleven microns), metallization utilized for electrical interconnection between various regions of the device (typically comprising aluminum) and for contacts to semiconductor regions has exhibited reflecting losses greater than about 95%, so that essentially very little heat is generated in the metallization by the absorption of incident radiation. Also, the large thermal conductivity of metallization will act as a heat sink, preventing the metallization from exhibiting a significant rise in temperature due to the absorption of incident radiation or conduction of heat.

At these wavelengths (nine to eleven microns), polycrystalline silicon, also commonly used for electrical interconnections, has a reflectivity of approximately 30% and an absorptivity of approximately 10 cm$^{-1}$. Thus, polycrystalline silicon will be heated to 500° C. or less upon application of laser energy to flow glass in accordance with this invention, and the polycrystalline silicon will not be affected by this slight heating.

Metal silicides, such as tungsten silicide ($WSi_2$), tantalum silicide ($TaSi_2$) and molybdenum silicide ($MoSi_2$) are also utilized to form electrical interconnects in semiconductor devices. Such metal silicides exhibit a reflectivity of approximately 60% to laser energy having wavelengths within the range of approximately nine to eleven microns, and thus are substantially unaffected by exposure to laser radiation utilized for glass flow provided this radiation is of short duration (as is the case when the laser energy is applied to a semiconductor device for the purpose of inducing glass flow).

Absorption of energy from the laser beam by silicon, such as the substrate material 16, occurs via photoexcitation of free carriers within the silicon with a small contribution due to multi-phonon excitation. The absorption is in proportion to the dopant concentration and inversely proportional to the carrier mobility. Therefore, the coupling efficiency is significantly less for metallization, polycrystalline silicon, metal silicides, doped silicon region 18 (FIG. 1) and bulk silicon 16, as compared to Si-O or Ge-O based material 12, thus minimizing the generation of heat within metallization, polycrystalline silicon, metal silicides, and bulk silicon. Due to the large mass of the bulk silicon in a semiconductor device, the temperature of the bulk silicon is not increased significantly due to the thermal conduction of heat from the glass layer being flowed.

The temperature T in a solid heated by a laser beam of incident intensity $I_o$ is given [1] as:

$$T = D \Delta^2 T + [I_o(1-R)/\rho C_p][\alpha \exp(-\alpha Z)] \quad (1)$$

where
D = the thermal diffusivity of the solid;
$\rho$ = the mass density of the solid;
$C_p$ = the specific heat of the solid;
R = the reflectivity of the solid;
$\alpha$ = the absorption coefficient of the solid;
Z = the coordinate parallel to the incident radiation; and $$\Delta^2 T = \partial^2 T/\partial X^2 + \partial^2 T/\partial Y^2 + \partial^2 T/\partial Z^2$$

where X, Y and Z are the cartesian coordinates of the solid. In the case of laser induced glass flow, $\alpha^{-1} << (2Dt)^{\frac{1}{2}}$, so that heat is created essentially at the surface and transported into the bulk by heat conduction. As described by Von Allmen, et al in "Laser-Solid Interactions and Laser Processing-1978" published by the American Institute of Physics, New York, 1979, pages 43-47, it may be assumed that D, $C_p$, and R are temperature invariant, $I_o$ is spatially and temporally uniform, and that no latent heat due to phase transitions is involved (glass is a super cooled liquid, and thus does not melt and does not vaporize appreciably during the glass flow process). Using these assumptions, Equation [1] gives:

$$T(Z,t) = T_o + [I_o((1-R)/\rho C_p)\sqrt{t/D}\,][2\,\text{ierfc}\,Z/(2\sqrt{Dt}\,)] \quad (2)$$

where
$T_o$ = the initial temperature of the surface; and
T(Z,t) = the temperature at a point Z and time, $0 \leq t \leq t_f$, where $t_f$ is the pulse width or the dwell time of the incident radiation.

The following physical constants are approximately the same for $SiO_2$ glass, $GeO_2$ glass and glass comprising both $SiO_2$ and $GeO_2$:
D = $6 \times 10^{-3}$ cm$^2$sec$^{-1}$
$\rho$ = 2.27 g cm$^{-3}$
$C_p$ = 1.0 Jg$^{-1}$°C$^{-1}$
R = 0.525

Figure 6:
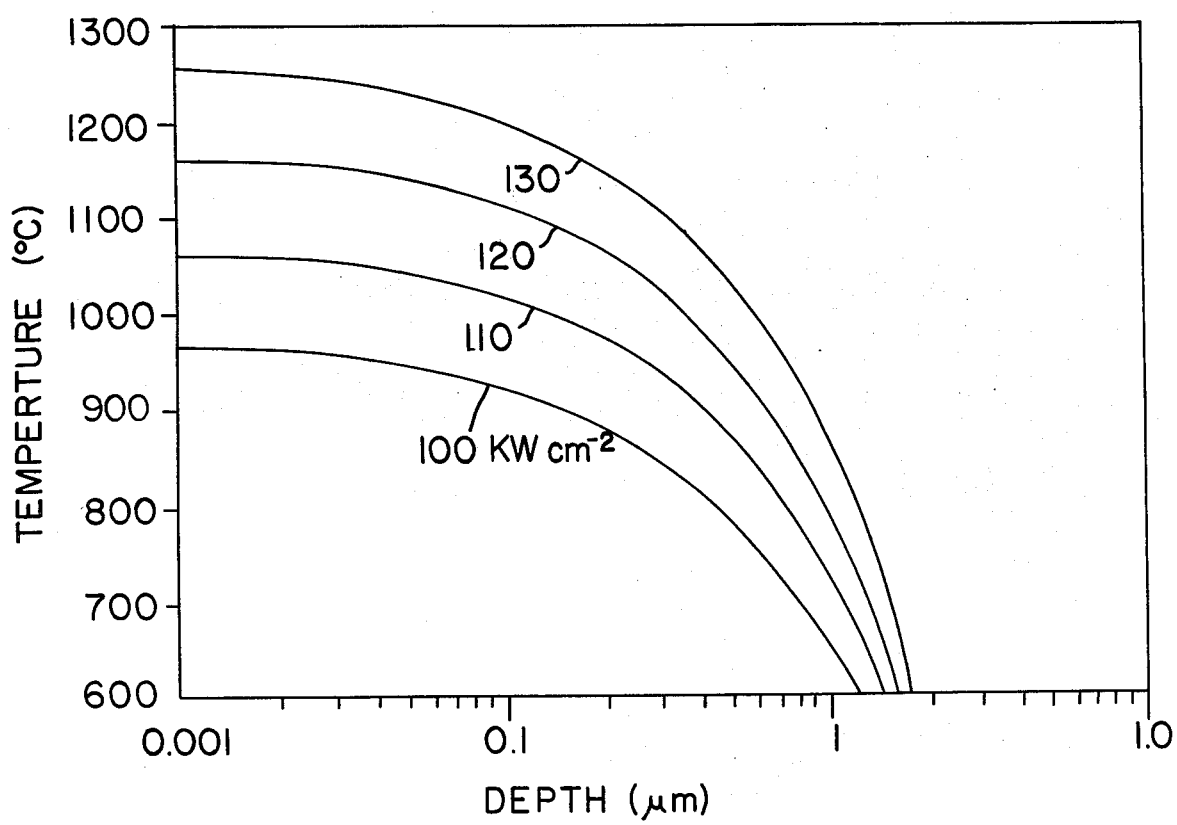
FIG. 6 is a graphical view of a theoretical temperature profile of phosphosilicate glass as a function of incident power density for a one millisecond laser pulse or dwell time independent of whether the laser is operated in the pulsed, Q-switched or continuous wave (CW) laser modes.

In FIG. 6 is plotted the calculated temperature profile, T(Z,t) as a function of Z, for $t_f$ = 0.001 sec and $I_o$ = 100, 110, 120 and 130 kW cm$^{-2}$. The temperatures shown in FIG. 6 are the maximum temperatures reached due to the application of 0.001 seconds of incident laser radiation. FIG. 6 is independent of the mode of laser operation. Naturally, after the removal of laser radiation from a region, the temperature drops as the heat generated within the region due to the application of laser energy is dissipated. These curves suggest that for Si-O, Ge-O, and Si-O/Ge-O glass thicknesses greater than about one micron large thermal gradients will exist which maintain the substrate at a relatively cool temperature during the high temperature flow of the glass which is formed on the surface of the device. FIG. 6 suggests that the typical glass thickness of approximately 1.5 microns used in semiconductor devices will be sufficient for this purpose and that a significant increase in thickness will not be beneficial. In support of this, consider that an incident energy of 120 kW cm$^{-2}$ will produce a surface temperature of 1,156° C., whereas the temperature at depths of 0.98, 1.47, and 2.45 microns will be 792° C., 664° C., and 409° C., respectively. The underlying portion 14 is then not subjected to substantially elevated temperatures due to the glass reflow process. In practice, $t_f$ is about 0.0001 second so underlying portion 14 is heated even less than shown in FIG. 6.

Of importance, the typical thickness of $SiO_2$ and/or $GeO_2$ glass utilized in semiconductor devices is in the range of 0.5 to 1.5 microns. Thus, utilization of this invention to induce densification or flow of $SiO_2$ and/or $GeO_2$ glass requires no special processing techniques in forming the glass.

If the substrate is heated, it will be noted that $T_o$ is increased, and the power density necessary to provide a certain $T(Z,t) - T_o$ decreases due to the decreased heat sinking ability of the heated substrate.

It should be recognized that the present method has the most significant advantage in that the glass 12 (FIG. 1) can be induced to flow and/or densify by application of heat thereto through use of the laser 30, but with it being understood that the glass 12 is heated to an extent substantially greater than the region 14. As discussed above, it will be seen that the surface of the glass 12 can be heated to an elevated temperature, whereas the glass 12 at a depth of about 1.47 microns will be heated to a much lower temperature.

The result of the method described above is shown in FIG. 2. It will be seen that a great degree of smoothing of the surface 13 of the glass 12 has been achieved by subjecting glass 12 to a laser beam in accordance with this invention for 0.001 seconds. This is highly desirable for purposes of etching since the placement of the etching window defined by well-known photoresist techniques can be more accurately achieved with a smooth approximately flat surface than with a sharp edge. This is to be compared with FIG. 1, wherein if etching was to take place without such flow the photoresist edges would have to be placed approximately where the "shoulders" 13A, 13B are defined by the glass 12 in order to prevent undercutting of the glass surrounding the etched window. Thus, because of the relatively smooth shape of the glass 12 as shown in FIG. 2, the etching can be controlled as chosen to a higher degree.

Figure 2:
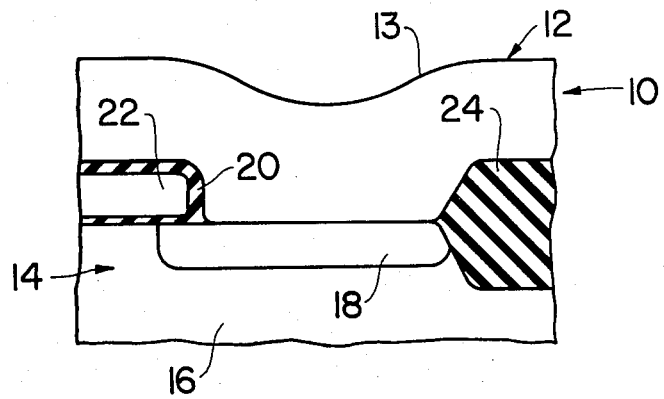
FIG. 2 is a view similar to FIG. 1 but shows a smooth concavity in the surface of the semiconductor device after the surface has been scanned with a laser beam in accordance with this invention.
Figure 3:
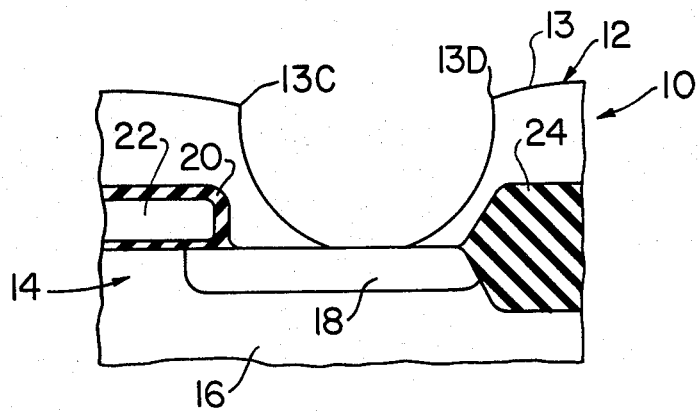
FIG. 3 is a view similar to FIGS. 1 and 2 but showing the surface of the semiconductor structure after the structure of FIG. 2 has been etched to form a concavity with sharp edges.

The result of such etching of the FIG. 2 structure is shown in FIG. 3. It is to be noted that while etching down to the substrate 16 in the chosen place and in the chosen manner has been achieved, sharp corners 13C, 13D are now defined by the glass 12. The glass flow process of this invention as described above is again undertaken in the same manner, thereby causing the glass 12 to again flow, so as to smooth all the phosphosilicate glass surface 13 as shown in FIG. 3, and in particular to smooth the corners 13C, 13D shown in FIG. 3. The resulting structure is shown in FIG. 4.

Figure 4:
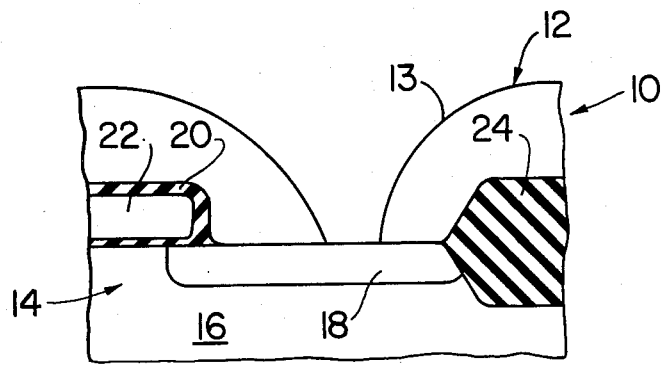
FIG. 4 is a view similar to FIG. 3 but showing the concavity after being heated with a laser beam to smooth the sharp edges of the concavity.
Figure 5:
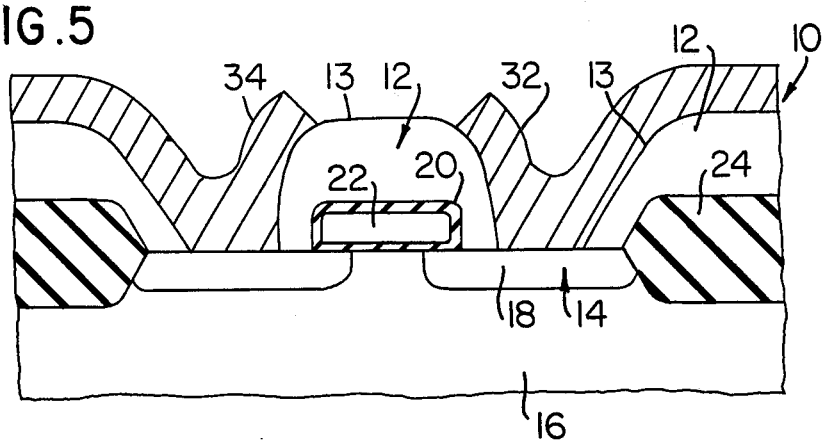
FIG. 5 is a view similar to FIGS. 1-4 but showing a complete device with metal contacts deposited over the smooth edges.

The smoothing of the phosphosilicate glass 12 into the form shown in cross-section in FIG. 4 allows for the proper placement of the metallization contacts and leads 32, 34 as shown in FIG. 5, it being noted that FIGS. 1 through 4 have in fact shown the process as undertaken on the right hand half of the structure of FIG. 5, which will readily be seen to be part of an MOS device. It is thus insured that cracking of the metallization leads 32, 34 will not take place due to the removal of sharp corners within glass 12.

It is to be understood that although an MOS structure is shown in the illustration of the present process, such process can readily be used in bipolar structures. As also discussed above, the process is intrinsically independent of the mole percentage of dopants in the glass (typically $P_2O_5$, $As_2O_5$, or $B_2O_3$) up to a dopant concentration of about 20 mole percent.

Through the use of a laser as described above, it will also be seen that extremely small areas can be made to flow as desired dependent on the laser beam cross-section The $CO_2$ laser described above as suitable for use in one embodiment of this invention can be operated in a number of different modes. For example, the laser can be operated in the continuous wave (i.e. CW) mode, a Q switched mode which comprises either a single very short pulse or a sequence of very short pulses, a chopped mode which basically is the chopping of a CW mode to provide a square wave pattern of energy, or a pulsed mode of operation. All of these modes are well-known to those skilled in the laser arts and thus will not be described in detail. However, it has been found that the preferred mode of operation of the $CO_2$ laser for use in this invention is in the pulsed mode of operation as described above in the examples.

A method has been described whereby a film of germanosilicate glass, $(SiO_2)$ $1-x$ $(GeO_2)$ x, is made to flow, by a large and rapid decrease in viscosity induced by localized heating, over and near other material such as single crystal silicon, polycrystalline silicon, and aluminum, without affecting the properties of the other material. This method is based upon the fact that 9-11 $\mu$m radiation will be selectively absorbed by germanosilicate glass which as a result will be elevated in temperature, whereas the other material adjacent the glass by virtue of its high reflectivity or low absorbtivity, will remain unaffected. Furthermore, since the irradiated energy is deposited in less than $\sim 10^{-4}$ sec., thermal conduction from the germanosilicate glass to the other material is minimal.

In implementing the invention, test structures of germanosilicate glass, nominally 1.3 $\mu$m thick, of a composition nominally 50:50 mole % $SiO_2$-$GeO_2$, were chemically vapor deposited at atmospheric pressure (CVD) at 400° C. over aluminum lines 0.7 $\mu$m thick and 7 $\mu$m wide with an edge to edge distance of 5$\mu$m. The aluminum lines were either on single crystal silicon or 0.2 $\mu$m of thermal oxide. In some cases the germanosilicate glass was doped with $P_4O_{10}$. The germanosilicate glass was doped with phosphorus in the range of 3-7% wt of phosphorus. Glass flow was accomplished using 9-11 $\mu$m radiation from three different types of laser sources as described above. Subsequent depth profiling of aluminum after etching on structures subjected to this treatment did not reveal any evidence of alloying by the aluminum to the silicon substrate. By using a TEA $CO_2$ laser with 10.6 micron emission the glass flow under appropriate conditions was found to be uniform over the entire irradiated area with no dependence on overlap.

FIGS. 7a through 7d illustrate one procedure for scanning a semiconductor wafer in accordance with this invention.

FIG. 7a depicts the number of exposures to laser beam energy of a region which has been subjected to three sequential irradiations from a laser beam of square cross-sectional area, with each successive irradiation being moved to the right but overlapping the previous irradiation by 50%. Thus, the region irradiated comprises four subsections, with the outer two subsections each receiving a single irradiation, and the two inner subsections each receiving two irradiations of laser energy. FIG. 7b depicts the number of laser irradiations received after the laser beam has completed a complete scan of 18 individual irradiations (again, each having 50% overlapp with the previous), forming a raster scanned line, as well as two additional irradiations on a raster line adjacent to the first raster line. The irradiations of the second raster line overlap each other in the x-direction by 50%, and overlap the irradiations of the first raster line in the y-direction by 50%. FIG. 7c shows the region after irradiation by two complete raster lines, as well as two irradiations of the third raster line. FIG. 7d shows the region after irradiation by a plurality of 18 raster lines, each raster line containing 18 individual laser irradiations. As shown by the numbering of FIG. 7d, the four corner subsections each receive a single dose of laser energy. The remaining subsections along the periphery of the irradiated area each receive two doses of laser irradiation. The remaining subsections each receive four individual doses of laser energy, although numbers have been omitted from the most interior subsections in order to aid in the clarity of FIG. 7d. In the above procedure, each dose of laser energy would be at an energy level and for a duration as described above.

The above examples describe certain pulse widths and frequencies for use with this invention. As the pulse width remains constant but the frequency of application of the pulses goes up, the material scanned by the laser beam does not have time to dissipate a substantial part of the energy imparted to the material by the laser beam. At some repetition rate, as the repetition rate goes up, the material will be unable to withstand the thermal stresses induced by the energy being applied to the material and the process therefore will not yield satisfactory results. At the other extreme, as the repetition rate of the laser pulses on a given section of material is decreased, in the limit, one pulse is applied to the area of material. It is clear that in this limiting situation, the laser beam will serve to reflow and/or densify the glass material. While it is understood that the duration and shape of the laser beam pulse influences the results obtained, the optimum way to apply the laser beam energy to the glass material to achieve the best results is not yet fully understood. The above descriptions represent merely the current understanding of the best way in which to achieve the results described. Furthermore, the optimum power, pulse width, pulse shape and dwell time (CW mode) will change over a small range with changes in glass composition and changes in structure on which the glass is formed. The relationship between optimum power pulse width, pulse shape, and dwell time (CW mode) and glass composition and structure is not yet fully understood.

It should be understood that any laser which yields a laser beam with a wave length which takes advantage of the absorption spectra of silicon oxide and germanium oxide glass mixtures (preferably in the wave length range between nine and eleven microns) is suitable for use with this invention.

In another example, $n^+/p$ diode structures were fabricated with contact holes to the $N^+$ region. A 0.18 $\mu$m thick thermal oxide grown at 920° C. in pyrogenic steam on p-type <100> silicon doped with boron to a resistivity of 5-9 $\Omega$-cm was used as an implant mask. Arsenic was implanted as $As_2^+$ to a dose of $6 \times 10^{15}$ ions $cm^{-2}$ at an energy of 100 KeV. Phososilicate glass ("PSG") was deposited at 410±5° C. in an atmospheric pressure system at a deposition rate of 900 Åmin$^{-1}$ to a thickness of 1.0 or 1.5 $\mu$m. The phosphorus concentration was varied from 4 to 7 wt % depending upon the relative silane to phosphine ratio used. Prior to contact masking and subsequent wet etching some glass samples were densified at 920° C. in a wet oxygen ambient, followed by a short nitrogen anneal.

In this example, laser flow was performed, with a $CO_2$ gas laser at 10.6 $\mu$m operating continuous wave (CW) in the $TEM_{oo}$ mode. Laser power, incident at the sample, was varied from 35 to 45 watts. The beam was focused onto the sample with a 127 mm focal length ZnSe lens to a spot size of about 205 $\mu$m. The sample wafers were held at room temperature in air by a copper vacuum chuck mounted on a computer controlled x-y translation stage. Raster scanning over large areas was accomplished by moving in the x-direction at 2.0 cm sec$^{-1}$ and stepping in the y-direction by 0.01 cm. This resulted in an irradiated dwell time of approximately 0.01 sec and a 50% lateral scan overlap. The change from the cylindrical-vertical slope, characteristic of prior art wet-etched glass, to the gradual taper and rounded edges and corners of the laser flowed glass was most prominent. Unlike conventional thermal flow, using laser flow in accordance with this invention, the contact hole area showed no evidence of shrinkage due to spreading of the flowed glass over the oxide. Furthermore, no flow of the thermal oxide occurred. The topography of the flowed PSG was independent of direction of laser beam scan.

The threshold for laser activated flow, for the structure and conditions of this example, was estimated to be 112 kW cm$^{-2}$, and was found to be particularly critical. A slight decrease (e.g. about 2 percent) in power density resulted in no signs of glass flow. A concomitant increase of similar magnitude resulted in severe distortion of the diode structure, i.e. excess flow and apparent cracking of the thermal oxide. The threshold and the magnitude of the flow, as measured by the change in slope of the contact hole, were found to be essentially invariant with respect to the glass thickness from 1.0 to 1.5 $\mu$m and the phosphorus concentration from 4 to 7 percent, by weight. Of paramount interest is the fact that both the threshold and the magnitude of flow were independent of the glass densification process (the densification process results in an increased density of the glass, an increase in the refractive index of the glass, and a decrease in the etch rate of the glass when etched with, for example, aqueous HF). By way of comparison, conventional thermal flow parameters, i.e. temperature, time, and ambient atmosphere, show a marked dependence on phosphorus concentration as well as on densification. The significance of these results is that the glass densification step may be eliminated, and more importantly, multiline operation (e.g. operation of the laser with more than a single wavelength output) permits the use of high power lasers (i.e. 1 kW) with processing speeds of the order of 20 sec per four-inch diameter wafer.

Preliminary results show that no annealing of the $N^+$ region occurred during the laser flow. The absence of any dopant redistribution, in addition to no change in the reverse current and carrier lifetime characteristics of the diode structures attest to the selectivity of the laser activated flow process.

Bubbles may form when flowing glass over metal (typically aluminum or aluminum alloys) when the pulse width (or the dwell time for lasers operating in the CW mode and scan across the wafer) is excessive. For example, a pulse width (or dwell time for CW lasers) of 0.1 seconds results in very large (several hundred micron) bubbles in the flowed glass over metal. Bubbles can be prevented by using a pulse width (or dwell time)

which is relatively short. It has been found that a pulse width or dwell time of 100 microseconds will prevent the formation of bubbles in the flowed glass, although the upper limit for pulse width or dwell time which will prevent the formation of bubbles has not been determined.

Thermal slip (e.g. one layer of the silicon crystal lattice shifting over the adjacent layer) may be caused during glass flow utilizing lasers. Thermal slip may be avoided by using sufficiently low power, sufficiently low pulse width in the pulse mode, or heating the substrate to reduce the temperature gradiant of the silicon substrate.

Further damage to the wafer, as well as non-uniform glass flow, is caused by irregularities in the pulse shape and width and by laser beam irregularities (non-uniform power across the cross-section of the laser beam). This so-called "random" damage may be prevented by providing highly uniform pulses and a highly uniform power distribution across the laser beam cross-section.

While this invention has been described in its examples as appropriate for use with $SiO_2$, Si-O bonded materials, $GeO_2$, Ge-O bonded materials and mixtures thereof, this invention is suitable for use with any material that would absorb energy at these special wave lengths, whether the material be glass or crystal.

Furthermore, while for simplicity the drawings have been described as incorporating a single layer metallization system, this invention can also be used with a multilayer interconnect structure of a type well known in the semiconductor arts.

While illustrative embodiments of this invention have been described, other embodiments within the scope of the attached claims will be obvious to those skilled in the semiconductor arts in view of this disclosure.

What is claimed is:

1. A method of inducing flow or densification of a first portion of a structure in close proximity to a second portion of the structure, said structure portion including a silicon substrate and interconnect metallization, said first portion being of the type wherein flow or densification is induced therein upon application of heat thereto, said method comprising laser heating said first portion to an extent substantially greater than said second portion wherein said first portion comprises germanium-oxygen bonded material.

2. The method of claim 1 wherein said first portion comprises at least 80 mole percent germanium-oxide bonded material.

3. The method of claim 1 wherein said first portion comprises a mixture of silicon-oxygen bonded material and germanium-oxygen bonded material.

4. The method of claim 3 wherein said first portion comprises a mixture of at least 80 mole percent silicon-oxygen bonded material and germanium-oxygen bonded material.

5. The method of claims 1, 2, 3, or 4 wherein at least a part of said second portion interconnect metallization comprises metal.

6. The method of claims 1, 2, 3 or 4 wherein the step of heating said first portion to an extent substantially greater than said second portion comprises subjecting said first portion to a laser beam having a wavelength of from 9 to 11 microns and coupled in energy absorption to said first portion.

7. The method of claim 6 wherein said laser beam is provided by a $CO_2$ laser having a waveform including a narrow high powered spike and a power tail of from approximately 100 to 200 microseconds in width.

8. The method of claim 7 wherein said $CO_2$ laser is a tunable $CO_2$ laser.

9. The method of claim 6 wherein said laser beam is provided by an $N_2O$ laser.

10. The product manufactured by the method of claims 1, 2, 3 or 4.

11. The product manufactured by the method of claim 5.

12. The product manufactured by the method of claim 6.

13. The product manufactured by the method of claim 7.

14. The product manufactured by the method of claim 8.

15. The product manufactured by the method of claim 9.

* * * * *